(12) United States Patent
Son et al.

(10) Patent No.: US 6,191,997 B1
(45) Date of Patent: Feb. 20, 2001

(54) MEMORY BURST OPERATIONS IN WHICH ADDRESS COUNT BITS ARE USED AS COLUMN ADDRESS BITS FOR ONE, BUT NOT BOTH, OF THE ODD AND EVEN COLUMNS SELECTED IN PARALLEL.

(75) Inventors: Jin Seung Son, Cupertino; Li-Chun Li, Los Gatos, both of CA (US)

(73) Assignee: Mosel Vitelic Inc. (TW)

( * ) Notice: Under 35 U.S.C. 154(b), the term of this patent shall be extended for 0 days.

(21) Appl. No.: 09/523,590

(22) Filed: Mar. 10, 2000

(51) Int. Cl.⁷ ....................................................... G11C 8/00
(52) U.S. Cl. .................. 365/230.04; 365/230.03
(58) Field of Search ........................... 365/230.03, 230.04

(56) References Cited

U.S. PATENT DOCUMENTS

| | | | |
|---|---|---|---|
| 5,416,743 | 5/1995 | Allan et al. | 365/203 |
| 5,559,990 | 9/1996 | Cheng et al. | 395/484 |
| 5,663,924 | 9/1997 | Barth, Jr. et al. | 365/230.03 |
| 5,852,586 | 12/1998 | Fujita | 365/233 |
| 5,892,730 | 4/1999 | Sato et al. | 365/233 |
| 5,920,511 | 7/1999 | Lee et al. | 365/189.05 |
| 5,939,913 | 8/1999 | Tomita | 327/158 |
| 5,940,329 | 8/1999 | Seitsinger et al. | 365/189.05 |
| 5,973,991 | 10/1999 | Tsuchida et al. | 365/233 |
| 5,991,232 | 11/1999 | Matsumura et al. | 365/233 |
| 6,064,625 | * 5/2000 | Tomita | 365/233 |

OTHER PUBLICATIONS

"16Mb: x16 1T SDRAM, Synchronous DRAM MT48LC1M16A1 SIT", Micron Technology, Inc., 1999, pp. 1–50.

"16Mb: x16 SDRAM, Synchronous DRAM MT48LC1M16A1 S", Micon Technology, Inc., 1999, pp. 1–50.

Betty Prince, "High Performance Memories. New architecture DRAMs and SRAMS evolution and function", John Wiley & Sons, West Sussex, England, 1996, pp. 135–245.

\* cited by examiner

*Primary Examiner*—David Nelms
*Assistant Examiner*—M. Tran
(74) *Attorney, Agent, or Firm*—Skjerven Morrill MacPherson LLP; Michael Shenker

(57) ABSTRACT

In a burst operation, a counter (18) receives one or more bits of a starting column address. The count signal (A[2:1]) generated by the counter is provided to an address adder (20). The address adder generates column address bits (B[2:1]) for a column to be selected in the burst operation. The Y-decoder circuitry (16.0, 16.1) selects an even column and an odd column in parallel. The count address bits (A[2:1]) are used as address bits for the even column, and the address bits (B[2:1]) generated by the address adder are used as address bits for the odd column, or vice versa. The even and odd columns can be at non-consecutive column addresses, or they can be at consecutive column addresses starting at an odd column address boundary. Some embodiments are suitable for burst operations defined by standards for synchronous dynamic random access memories. Some embodiments are suitable for double data rate memories.

17 Claims, 15 Drawing Sheets

MEMORY BURST OPERATIONS IN WHICH ADDRESS COUNT BITS ARE USED AS COLUMN ADDRESS BITS FOR ONE, BUT NOT BOTH, OF THE ODD AND EVEN COLUMNS SELECTED IN PARALLEL.

BACKGROUND OF THE INVENTION

This invention relates to memories, and more particularly to burst operations in memories.

To improve memory data rates, some memories support burst operations. In a burst operation, multiple memory locations are accessed in response to a single starting address. At the beginning of a burst operation, a row address AX (FIG. 1) is delivered to X-decoders 14. X-decoders 14 select the corresponding row of memory cells in memory array 12. (In FIG. 1, rows are vertical, and columns are horizontal.) The row remains selected for the duration of the burst operation. The starting column address AY is delivered to column address counter 18. Counter 18 counts up by 1 starting from address AY on each cycle of clock signal CLK, and provides the count A to Y-decoders 16. This causes Y-decoders 16 to select consecutive columns, at consecutive column addresses A, in consecutive cycles of clock CLK. As a result, the memory is accessed sequentially. The data D are transferred from the consecutive memory locations (i.e., memory locations at consecutive addresses) to an input/output (I/O) pad 30, or in the opposite direction, at the frequency of clock CLK. The data rate is improved because the same memory row remains selected for multiple memory locations and because, therefore, the row decoding need not be done for each memory location.

Disadvantageously, column address counter 18 operates at the same frequency as the data rate on I/O pad 30 (the frequency of clock CLK).

FIG. 2 shows a memory in which the column address counter 18 can operate at only half of the data rate on pad 30. The memory uses a two-bit prefetch technique known as "2n rule". The memory cells are arranged in two arrays 12.0, 12.1. Memory array 12.0 contains even memory locations (that is, memory locations at even column addresses; when a column address is even, the entire row-and-column address is even if the column address is the least significant portion of the entire address). Memory array 12.1 contains odd locations. In a burst operation, an even location in array 12.0 and an odd location in array 12.1 at consecutive addresses are accessed in parallel at one half of the frequency of clock CLK, and are transferred between the memory arrays and a buffer 36 at one half of the clock frequency. The data are transferred between buffer 36 and I/O pad 30 serially at the clock frequency.

The burst operation proceeds as follows. The row address (not shown) is supplied to both of the arrays 12.0, 12.1, to select one row in each array. Column address counter 18 receives the most significant bits AY[n:1] of the starting column address. The least significant bit AY[0] is not used by the counter. The counter counts up from AY[n:1] by 1 on every other clock cycle. The counter's output (count) signal A[n:1] is delivered to Y-decoder blocks 16.0, 16.1 of respective arrays 12.0, 12.1. Count bits A[n:1] are all but the least significant bit (LSB) of the column address.

Y-decoder blocks 16.0, 16.1 are identical. Y-decoder block 16.0 selects an even column. For this column, the column address LSB A[0]=0. Y-decoder block 16.1 select an odd column, corresponding to A[0]=1. As a result, two memory locations at column addresses <A[n:1],0>, <A[n:1], 1> are accessed in parallel at one half of the clock frequency, with the data transferred to or from buffer 36. The data are transferred between buffer 36 and I/O pad 30 serially at the clock frequency.

The 2n rule memory of FIG. 2 is not well suited for burst operations that access memory non-sequentially or not at an even address boundary. Examples of such burst operations are burst operations defined by standards for synchronous dynamic random access memories (SDRAMs) and described in Table 1 below. The sequence of memory locations accessed in each burst operation of Table 1 is determined by the burst length (2, 4, or 8), burst mode (sequential or interleaved), and the three least significant bits AY[2:0] of the starting column address. The burst length and mode can be programmed into the SDRAM's mode register (not shown) before a READ or WRITE command is issued to the SDRAM for the burst operation.

TABLE 1

| Burst Length | Starting Column Address LSBs AY[2:0] | Data Sequence: Sequential Mode | Data Sequence: Interleave Mode |
| --- | --- | --- | --- |
| 2 | xx0 | 0,1 | 0,1 |
|   | xx1 | 1,0 | 1,0 |
| 4 | x00 | 0,1,2,3 | 0,1,2,3 |
|   | x01 | 1,2,3,0 | 1,0,3,2 |
|   | x10 | 2,3,0,1 | 2,3,0,1 |
|   | x11 | 3,0,1,2 | 3,2,1,0 |
| 8 | 000 | 0,1,2,3,4,5,6,7 | 0,1,2,3,4,5,6,7 |
|   | 001 | 1,2,3,4,5,6,7,0 | 1,0,3,2,5,4,7,6 |
|   | 010 | 2,3,4,5,6,7,0,1 | 2,3,0,1,6,7,4,5 |
|   | 011 | 3,4,5,6,7,0,1,2 | 3,2,1,0,7,6,5,4 |
|   | 100 | 4,5,6,7,0,1,2,3 | 4,5,6,7,0,1,2,3 |
|   | 101 | 5,6,7,0,1,2,3,4 | 5,4,7,6,1,0,3,2 |
|   | 110 | 6,7,0,1,2,3,4,5 | 6,7,4,5,2,3,0,1 |
|   | 111 | 7,0,1,2,3,4,5,6 | 7,6,5,4,3,2,1,0 |

Columns 3 and 4 of Table 1 show the sequence in which the memory locations are accessed. For example, if the burst length is 4, the starting address is "x11" (i.e. AY[1:0]=11), and the mode is sequential, the locations are accessed in the order "3,0,1,2". This means the two LSBs A[1:0] of the accessed columns assume consecutively the values 3, 0, 1, 2 (binary 11, 00, 01, 10). The remaining column address bits A[n:2] are the same for each location, and are equal to the starting address bits AY[n:2]. For the burst length of 2, Table 1 provides the values of one LSB A[0] of the column address. The remaining column address bits A[n:1]=AY[n:1] are the same for each location accessed in the burst operation. For the burst length of 8, Table 1 provides the values of the three LSBs A[2:0]. The remaining address bits A[n:3]=AY[n:3] are the same for each location.

Each burst operation defined by Table 1 performs access to a block of consecutive memory locations, but the memory locations within the block can be accessed non-sequentially. The 2n-rule memory of FIG. 2 cannot prefetch data for non-consecutive locations. In addition, in Table 1, a burst operation can start at an odd address boundary. See for example the case of burst length=4, starting column address AY[2:0]=x01, sequential mode (locations 1,2 are to be accessed first, and they start at an odd address boundary). In the memory of FIG. 2, locations can be accessed in prefetch (i.e., in parallel) only if they start at an even address boundary. Therefore, there is a need for an alternative prefetch memory architecture that allows prefetches for non-consecutive memory locations and for locations starting at an odd column address boundary while allowing the address generation logic to operate at a lower rate than the data rate on the external input or output terminals (such as I/O pad 30).

Allowing the address generation logic to operate at a lower rate is particularly desirable in double data rate (DDR) SDRAMs which have emerged as a higher bandwidth memory solution than conventional SDRAMs. In DDR SDRAMs, data are provided on the external terminals on both the rising and falling clock edges. Thus, the data transfer rate is doubled. Address generation logic that can operate at a lower frequency is therefore particularly desirable.

SUMMARY

In some embodiments of the present invention, a prefetch can be performed for non-consecutive memory locations and/or memory locations starting at an odd column address boundary. In some embodiments, the memory includes a counter, an odd column decoder block, and even column decoder block, as in FIG. 2. However, the bits of the count signal are used as address bits for the even column decoder block but not for the odd column decoder block, or vice versa. The memory uses one or more bits A of the count signal to generate address bits B for the other decoder block, i.e., the decoder block for which the count signal bits are not used as address bits.

In some embodiments, if the starting address of the burst operation is even, the count bits A are used for the even decoder block, and the address bits B are used for the odd decoder block. If the starting address is odd, the count bits A are used for the odd decoder block, and the bits B for the even decoder block.

In other embodiments, the count bits A are always used for the odd decoder block, and the bits B for the even decoder block.

In some embodiments, a memory comprises a plurality of columns, an odd column decoder block, and an even column decoder block. A counter receives one or more bits of a starting column address of a burst operation and provides a count during the burst operation. The count comprises one or more bits of a first column address of a first column to be accessed in the burst operation. A first circuit receives one or more bits of the count and generates one or more bits of a second column address of a second column to be accessed in the burst operation in parallel with the first column. In at least one burst operation, the one or more bits of the first column address are different from the one or more bits of the second column address. One of the odd and even column decoder blocks is to decode an address signal comprising the one or more bits of the first column address, and, in parallel, the other one of the odd and even column decoder blocks is to decode an address signal comprising the one or more bits of the second column address, so that the odd and even column decoder blocks select in parallel an odd column and an even column at non-consecutive column addresses or at consecutive column addresses at an odd address boundary.

In some embodiments, a method for performing a burst operation comprises receiving one or more bits or a starting column address of the burst operation, counting from the one or more bits, and generating a count which comprises one or more non-LSB bits of the first column address of a first column to be accessed in the burst operation. The method further comprises receiving the one or more bits of the count and generating one or more non-LSB bits of a second column address of a second column to be accessed in the burst operation in parallel with the first column. The one or more non-LSB bits of the second column address are different from the one or more non-LSB bits of the first column address. One of the first and second column addresses is an even address and the other one of the first and second column addresses is an odd address. The method further comprises decoding a first address signal comprising the one or more non-LSB bits of the first column address, and decoding a second address signal comprising the one or more non-LSB bits of the second column address, and selecting, in parallel, an even column and an odd column at the first and second column addresses.

Other features and advantages of the invention are described below. The invention is defined by the appended claims.

DESCRIPTION OF PREFERRED EMBODIMENTS

Figure 3:
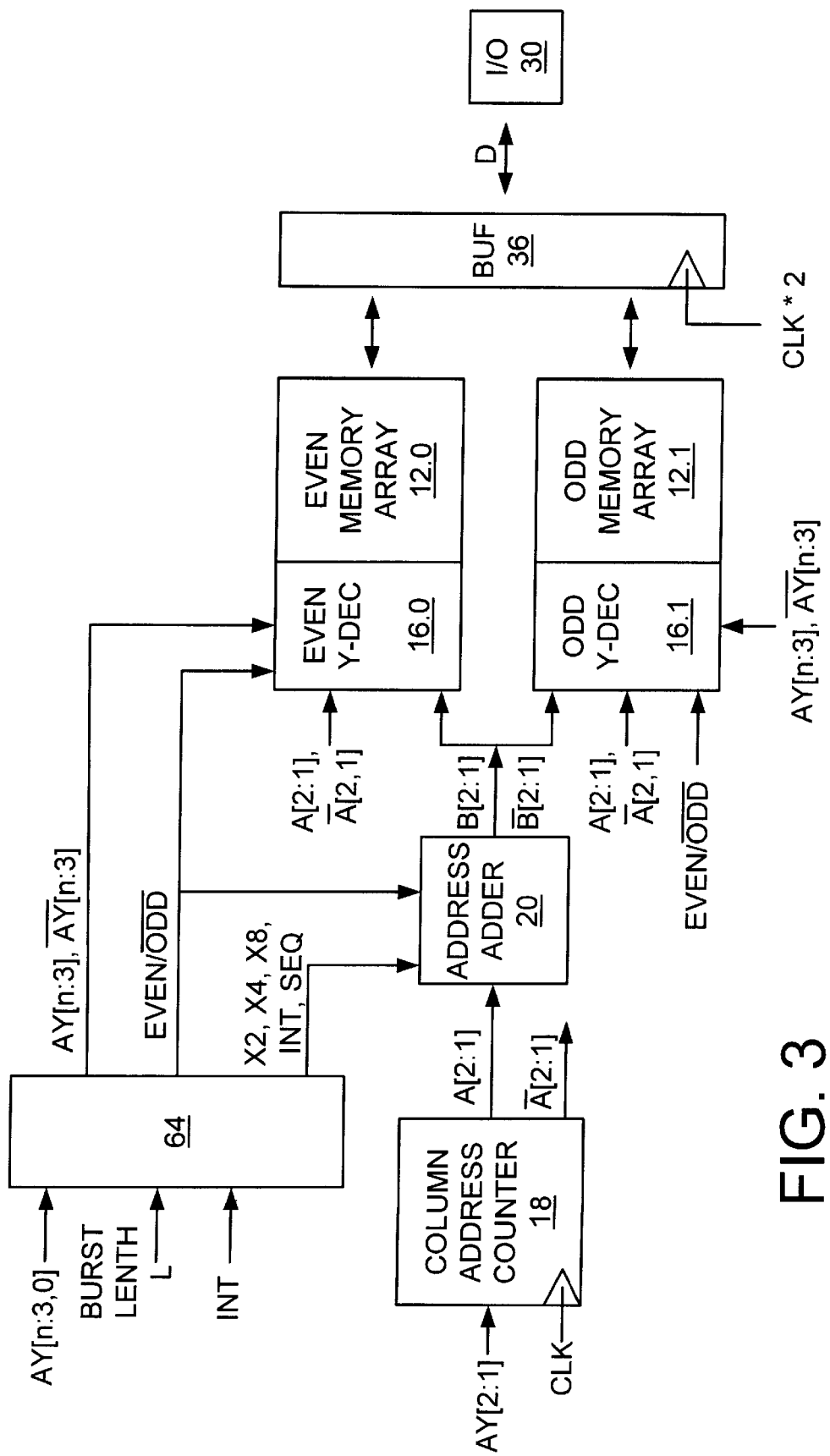
FIG. 3 is a block diagram of a memory according to some embodiments of the present invention.

FIG. 3 illustrates a memory capable to perform two-bit prefetches suitable for the burst operations of Table 1. Non-consecutive memory locations, and memory locations starting at an odd address boundary, can be accessed in parallel. For example, for a burst length of 4, starting address "x11", sequential mode, the locations "3,0" are accessed in parallel, and then the locations "1,2" are accessed in parallel. Similarly, for a burst length of 8, starting address "111", sequential mode, each pair of locations "7,0", "1,2", "3,4", "5,6" is accessed in parallel.

The memory of FIG. 3 operates at the double data rate (DDR). Hence, the data bits appear on I/O pad 30 at the frequency CLK*2. Counter 18 operates at half of that rate, counting up by 1 in each cycle of clock CLK. In other embodiments, the memory operates at a single data rate, or some other data rate, with counter 18 operating at half of the data rate on the I/O pad.

The memory of FIG. 3 contains even memory array 12.0 and odd memory array 12.1. Each memory array has row decoders (X-decoders), not shown, which select one row in each array at a row address AX for the duration of a burst operation, as in the memory of FIG. 2. I/O pad 30 is connected to buffer 36, as in FIG. 2. Buffer 36 and I/O pad 30 of FIG. 3 are similar to buffer 36 and I/O pad 30 of FIG. 2 (except that the buffer 36 transfers data to and from I/O pad 30 at the frequency CLK*2).

The even Y-decoder block 16.0 selects a column in memory array 12.0. Odd Y-decoder block 16.1 selects a colum n in memory array 12.1.

Counter 18 receives starting column address bits AY[2:1], and counts up by 1 (modulo 4). The counter output signal A[2:1] is provided to column address adder 20. Address adder 20 generates column address signal B[2:1] and its complement $\overline{B}$[2:1]. Address bits A[2:1], their complement $\overline{A}$[2:1] (generated by counter 18 or address adder 20), and address bits B[2:1], $\overline{B}$[2:1] are delivered to Y-decoder blocks 16.0, 16.1. Signals B[2:1], $\overline{B}$[2:1] are described below.

Logic block 64 receives starting column address bits AY[n:3,0], the burst length L, and an interleave mode flag INT. Logic 64 provides the following signals:

1. X2 (high when the burst length is 2);
2. X4 (high when the burst length is 4);
3. X8 (high when the burst length is 8);
4. INT (high indicates the mode is interleave);
5. SEQ=$\overline{INT}$ (high indicates the mode is sequential);
6. EVEN/$\overline{ODD}$ (high indicates the starting column address is even, that is, AY[0]=0);
7. AY[n:3] and its complement $\overline{AY}$[n:3].

Figure 1:
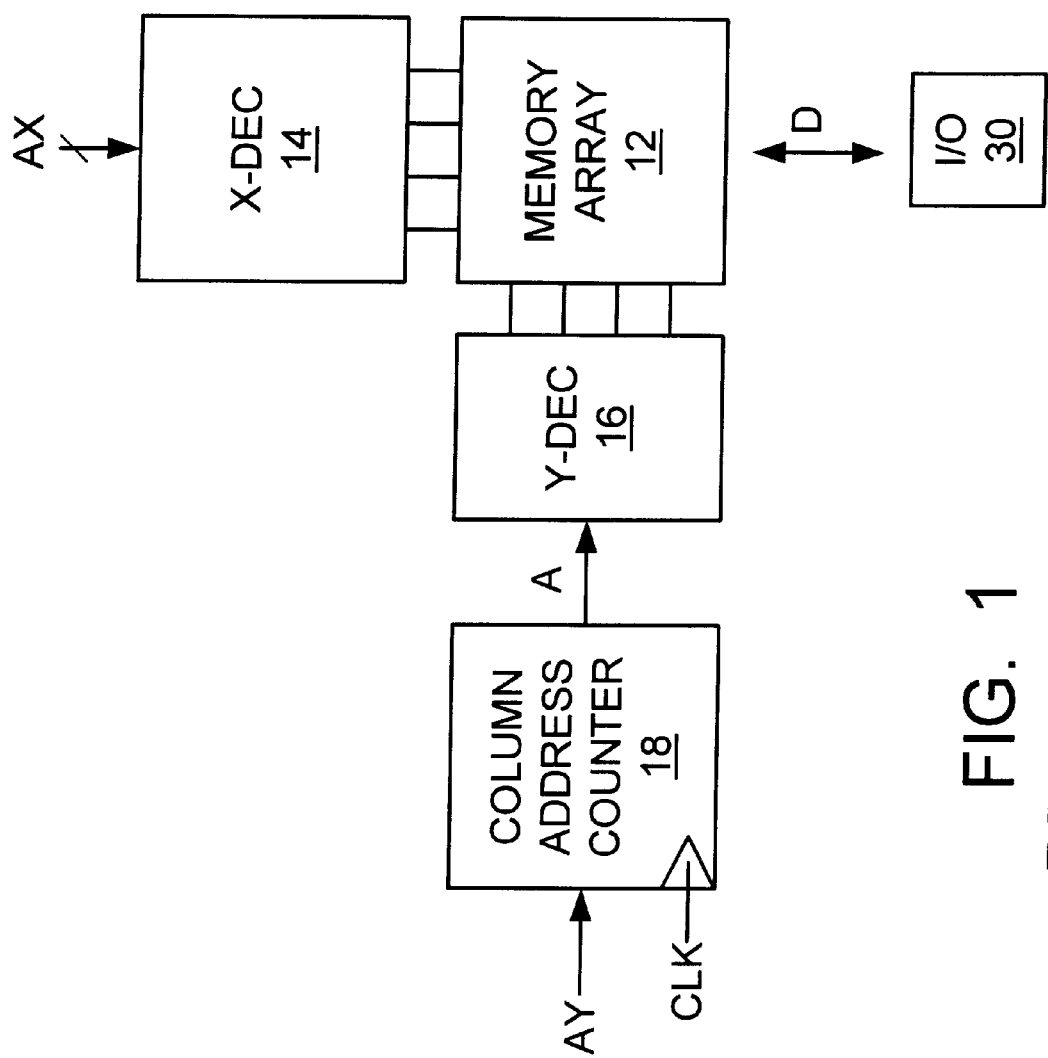
FIGS. 1 and 2 are block diagrams of prior art memories.
Figure 2:
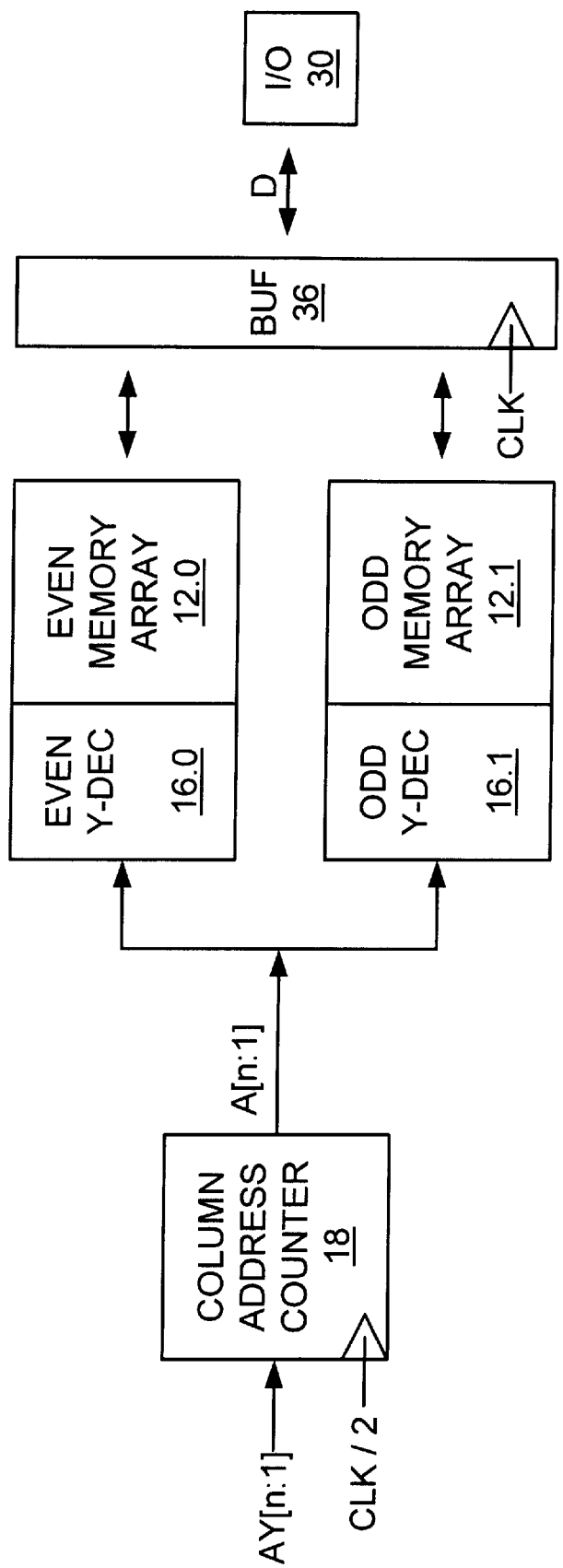

As in FIG. 2, each Y-decoder block 16.0, 16.1 decodes a partial address consisting of then most significant bits [n:1] of a column address. The bits [n:3] of the column address are AY[n:3]. Bits [2:1] are either A[2:1] or B[2:1]. More particularly, if the starting column address of the burst operation is even, then Y-decoder block 16.0 decodes the partial address <AY[n:3],A[2:1]>, and Y-decoder block 16.1 decodes the partial address <AY[n:3],B[2:1]>. If the starting address is odd, then Y-decoder block 16.0 decodes the partial address <AY[n:3],B[2:1]>, and Y-decoder block 16.1 decodes the partial address <AY[n:3],A[2:1]>. The address bits B[2:1] are generated to provide correct column selection for the operations of Table 1, as shown in Table 2 below.

More particularly, examination of Table 1 shows that if the mode is interleaved, or the burst length is 2, or the starting address is even, then the memory locations to be accessed in prefetch are always consecutive memory locations which start at an even boundary. Therefore, in this case, B[2:1]=A[2:1]. The Y-decoders select the same columns as in the memory of FIG. 2.

If the mode is sequential, the starting address is odd, and the burst length is 4, then the odd column selected must be the column at the address <AY[n:3],A[2:1],1>. For example, if the starting address is x01, then the first odd column selected is 1. The next odd column selected is 3, which corresponds to the column address bits [2:1] being incremented by 1. Since the Y-decoder block 16.1 decodes the address <AY[n:3],A[2:1]>, correct odd column selection is provided.

Examination of Table 1 shows that when the mode is sequential, the starting address is odd, and the burst length is 4, the even column address can be obtained by incrementing the odd column address by 1 modulo 4. This means the even column address bits B[2:1] can be obtained form the odd column address bits A[2:1] by setting B1=$\overline{A1}$, B2=A2. (We use "B2" to denote B[2], A2 to denote A[2], and so on.)

If the mode is sequential, the starting address is odd, and the burst length is 8, then the odd column selected must be the column at the address <AY[n:3],A[2:1],1>, as in the case of the burst length of 4. Therefore, correct odd column selection is provided by the odd Y-decoder block 16.1 decoding the address <AY[n:3],A[2:1]>.

The even column address is obtained by incrementing the odd column address by 1 modulo 8. Therefore, B1=$\overline{A1}$. Further, if A1 is high, then B2=$\overline{A2}$. If A1 is low, then B2=A2.

TABLE 2

| Condition | B[2:1] |
|---|---|
| Mode is interleaved, or Burst length is 2, or Starting address is even | B[2:1] = A[2:1] |
| Mode is sequential, and Starting address is odd, and Burst length is 4 | B2 = A2<br>B1 = $\tilde{A}$1 |
| Mode is sequential, and Starting address is odd, and Burst length is 8 | B1 = $\tilde{A}$1<br>If A1 is high, then B2 = $\tilde{A}$2<br>If A1 is low, then B2 = A2 |

Figure 4A:
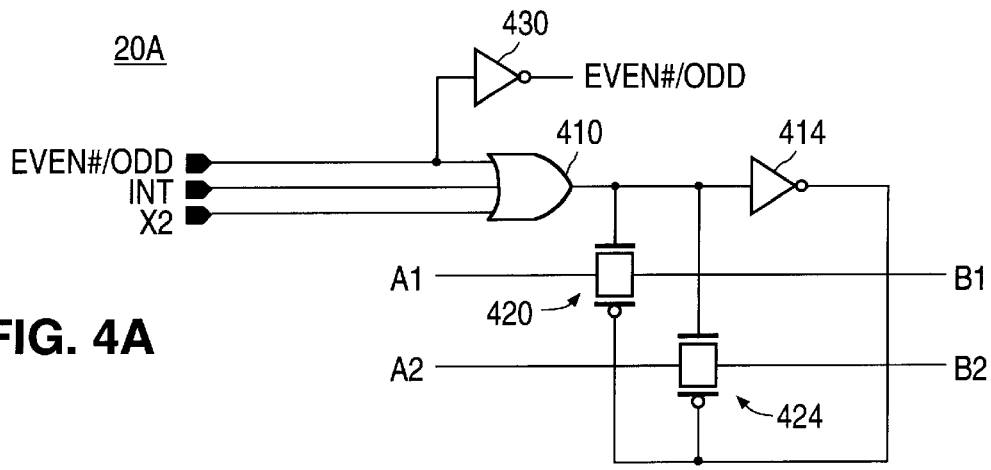
FIGS. 4A, 4B, 4C are circuit diagrams of portions of some embodiments of an address adder of the memory of FIG. 3.
Figure 4B:
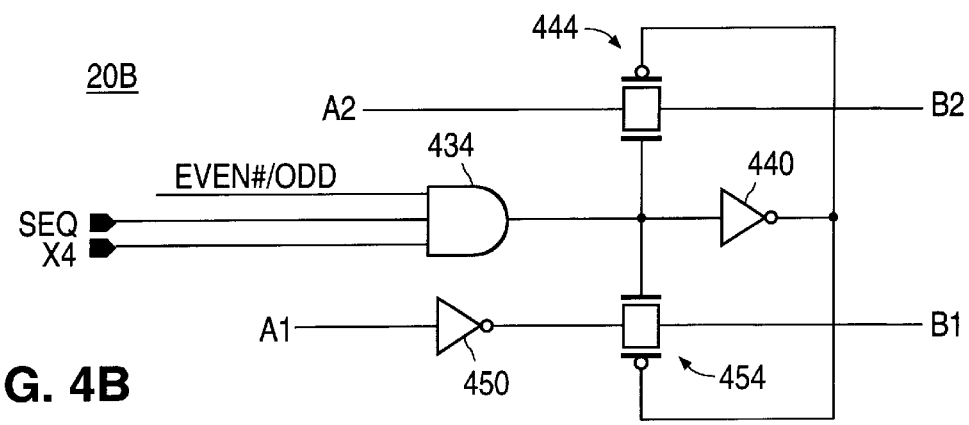
Figure 4C:
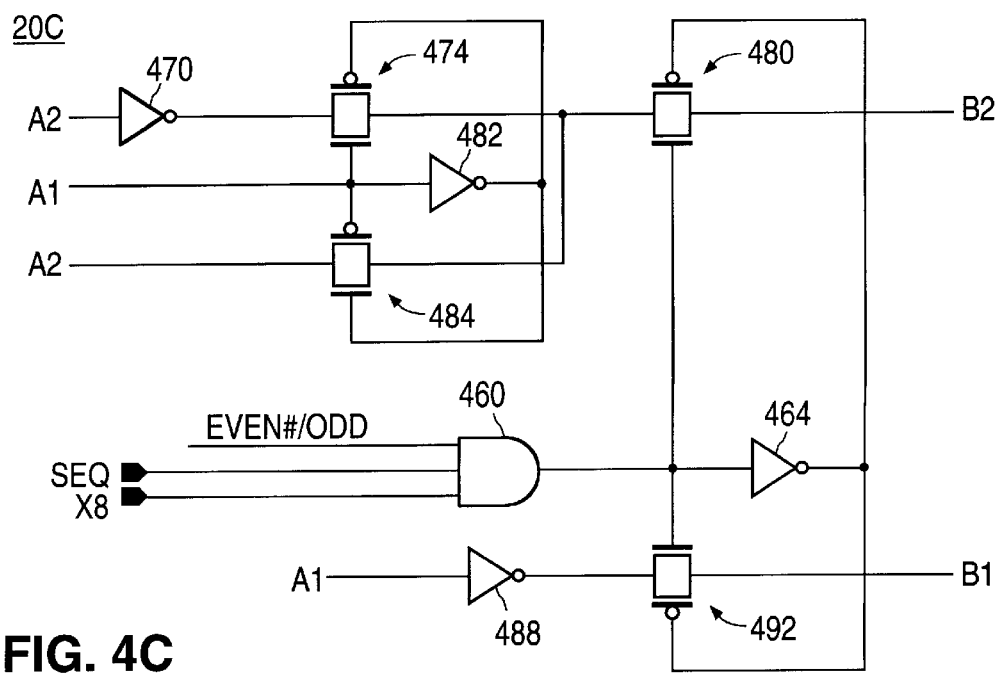
Figure 5:
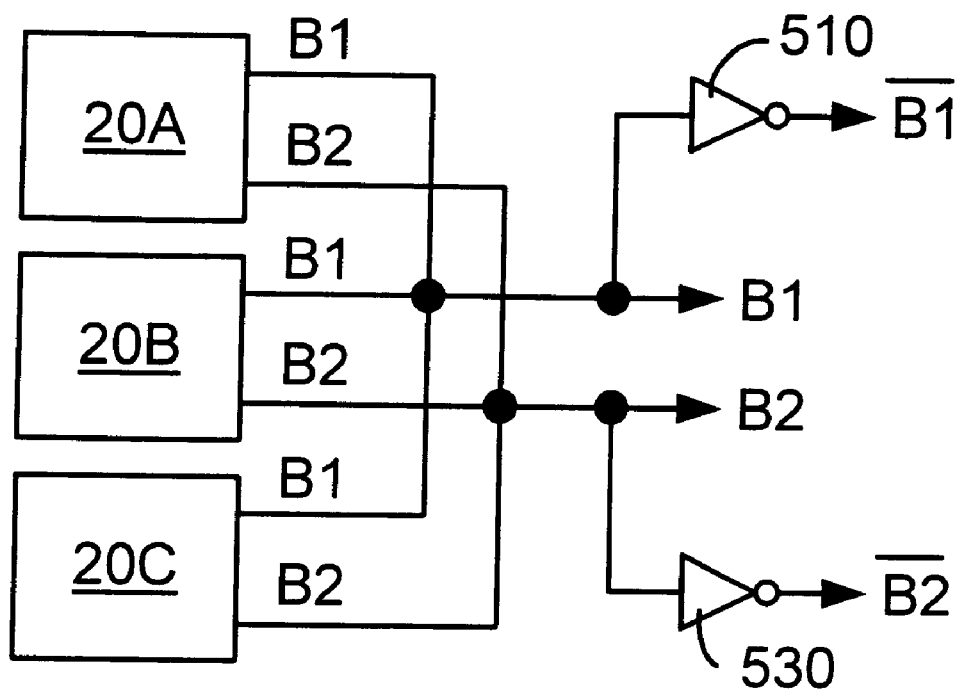
FIG. 5 is a block diagram of some embodiments of the address adder of the memory of FIGS. 3, 4A, 4B, 4C.

FIGS. 4A, 4B, 4C illustrate portions of one embodiment of adder 20. FIG. 5 is a block diagram of the whole adder 20 for the same embodiment. FIG. 4A illustrates a circuit 20A which generates the signals B[2:1] for the case when the starting address is even, or the mode is interleaved, or the burst length is 2. In all of the other cases, the outputs B1, B2 of circuit 20A are tri-stated. OR gate 410 generates the OR of signals EVEN/ODD#, INT, X2. (We use "#" to denote a signal's complement. Thus, EVEN/ODD# is the same as EVEN/$\overline{ODD}$.) The output of gate 410 is inverted by inverter 414. Signals A1, A2 are delivered to the inputs of respective transfer gates 420, 424. Each transfer gate is a pair of an NMOS transistor and PMOS transistor that are connected in parallel. One source/drain region of the NMOS transistor and one source/drain region of the PMOS transistor are connected to the input node of the transfer gate; the other source/drain region of the NMOS transistor and the other source/drain region of the PMOS transistor are connected to the output node of the transfer gate. The outputs of transfer gates 420, 424 provide the respective signals B1, B2. The NMOS gates of transfer gates 420, 424 are connected to the output of OR gate 410. The PMOS gates of transfer gates 420, 424 are connected to the output of inverter 414.

Inverter 430 inverts the EVEN/ODD# signal and provides its complement EVEN#/ODD to the circuits 20B, 20C of FIGS. 4B, 4C.

Circuit 20B (FIG. 4B) generates the signals B1, B2 for the case when the mode is sequential, the starting address is odd, and the burst length is 4. In all of the other cases, the outputs B1, B2 of circuit 20B are tri-stated. AND gate 434 generates the AND of signals EVEN#/ODD, SEQ, X4. The output of gate 434 is inverted by inverter 440. Signal A2 is delivered to the input of transfer gate 444. The output of gate 444 provides the signal B2.

Signal A1 is inverted by inverter 450. The output of inverter 450 is connected to the input of transfer gate 454. The output of gate 454 provides the signal B1.

The output of AND gate 434 is connected to the NMOS gates of transfer gates 444, 454. The output of inverter 440 is connected to the PMOS gates of transfer gates 444, 454.

Circuit 20C (FIG. 4C) generates the signal B[2:1] when the mode is sequential, the starting address is odd, and the burst length is 8. In all of the other cases, the outputs B2, B2 of circuit 20C are tri-stated. AND gate 460 generates the AND of signals EVEN#/ODD, SEQ, X8. The output of AND gate 460 is inverted by inverter 464.

Signal A2 is inverted by inverter 470. The output of inverter 470 is connected to the input of transfer gate 474. The output of transfer gate 474 is connected the input of transfer gate 480. The output of transfer gate 480 provides the signal B2.

Signal A2 is provided to the input of transfer gate 484. The output of transfer gate 484 is connected to the input of transfer gate 480.

Signal A1 is inverted by inverter 482. The output of inverter 482 is connected to the PMOS gates of transfer gates 474, 484. Signal A1 is delivered to the NMOS gates of transfer gates 474, 484.

Signal A1 is inverted by inverter 488. The output of inverter 488 is connected to the input of transfer gate 492. The output of transfer gate 492 provides the signal B1.

The output of inverter 464 is connected to the PMOS gates of transfer gates 480, 492. The output of AND gate 460 is connected to the NMOS gates of transfer gates 480, 492.

As shown in FIG. 5, the outputs B1 of circuits 20A, 20B, 20C are connected to a common node which is the output B1 of adder 20. The outputs B2 of circuits 20A, 20B, 20C are also connected to a common node which is the output B2 of adder 20. The outputs B1, B2 are connected to the respective inputs of inverters 510, 530. The outputs of inverters 510, 530 provide the respective signals $\overline{B1}$, $\overline{B2}$.

Figure 6A:
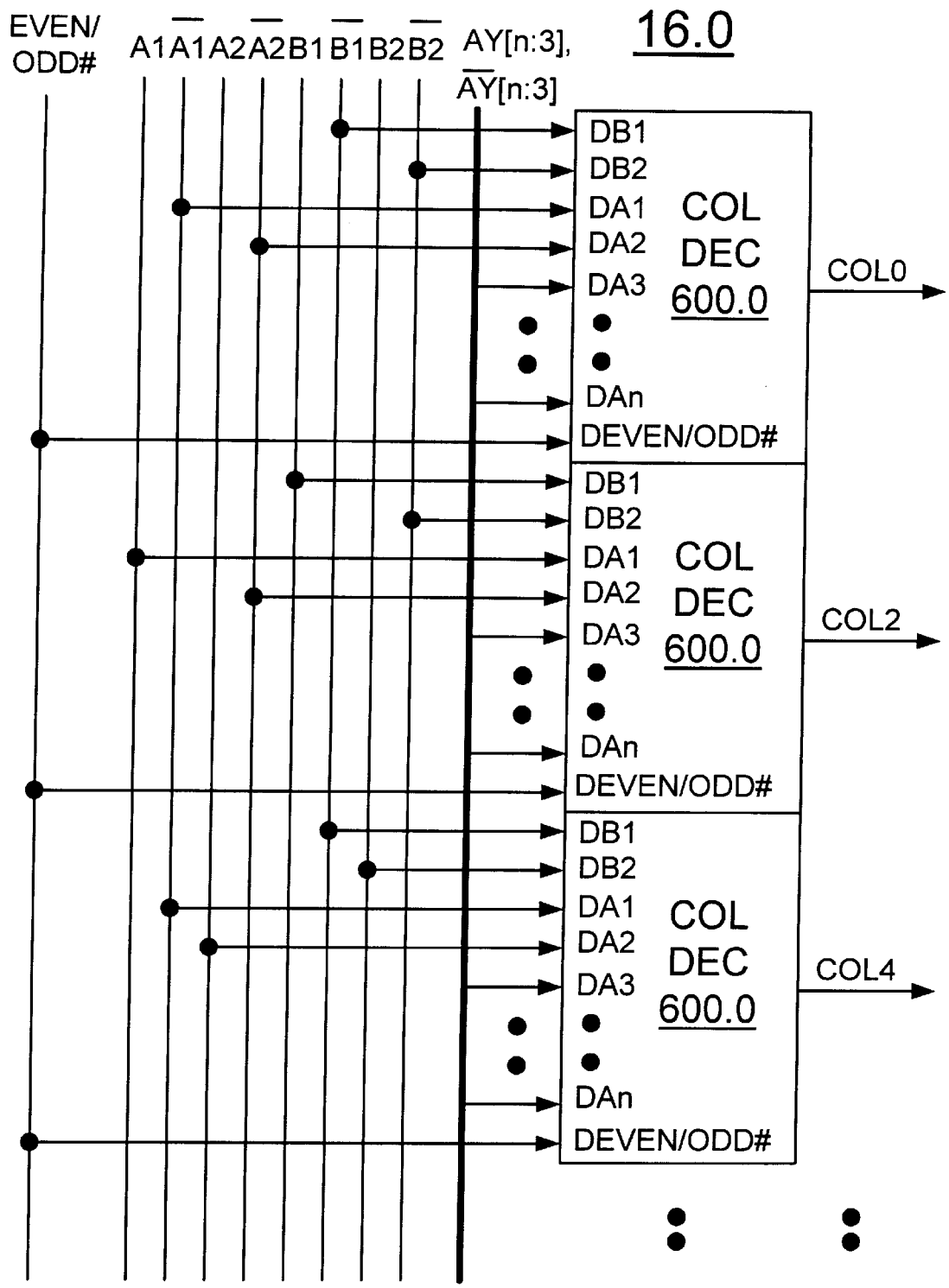
FIGS. 6A, 6B are block diagrams of column decoder blocks in some embodiments of the memory of FIG. 3.

FIG. 6A illustrates the even Y-decoder block 16.0. A separate decoder 600.0 is provided for each even column. Decoders 600.0 for columns 0, 2, 4, . . . generate respective select signals COL0, COL2, COL4, ... . All of decoders 600.0 are identical in one embodiment. Each decoder 600.0 has respective inputs DB1, DB2, DA1, . . . DAn, DEVEN/ODD#. The inputs DEVEN/ODD# of decoders 600.0 receive the signal EVEN/ODD# from logic 64 (FIG. 3). Inputs DB1, DB2, DA1, . . . DAn receive respective signals B1, B2, A1, A2, AY[3], . . . AY[n], or their complements, as needed to select the respective column. If the column's address bit i (i>2) is 0, then the input DAi receives the signal $\overline{AY}[i]$. If the address bit i is 1, then the input DAi receives AY[i]. Likewise, for i=1 or 2, if the address bit i is 0, the decoder inputs DAi, DBi receive respective output signals $\overline{Ai}$, $\overline{Bi}$ from counter 18 and address adder 20. If the address bit i is 1, the decoder inputs DAi, DBi receive the output signals Ai, Bi. For example, in column decoder 600.0 for column 0, the decoder inputs DB1, DB2, DA1, DA2, DA3, . . . DAn receive respective signals $\overline{B1}$, $\overline{B2}$, $\overline{A1}$, $\overline{A2}$, $\overline{AY}[3]$ . . . $\overline{AY}[n]$.

If the DEVEN/ODD# signal is high, the decoder's output COLi (COL0, COL1, and so on) is the AND of the decoder inputs DA1, . . . DAn. If the DEVEN/ODD# signal is low, the decoder's output is the AND of the decoder inputs DB1, DB2, DA3, . . . DAn.

Figure 6B:
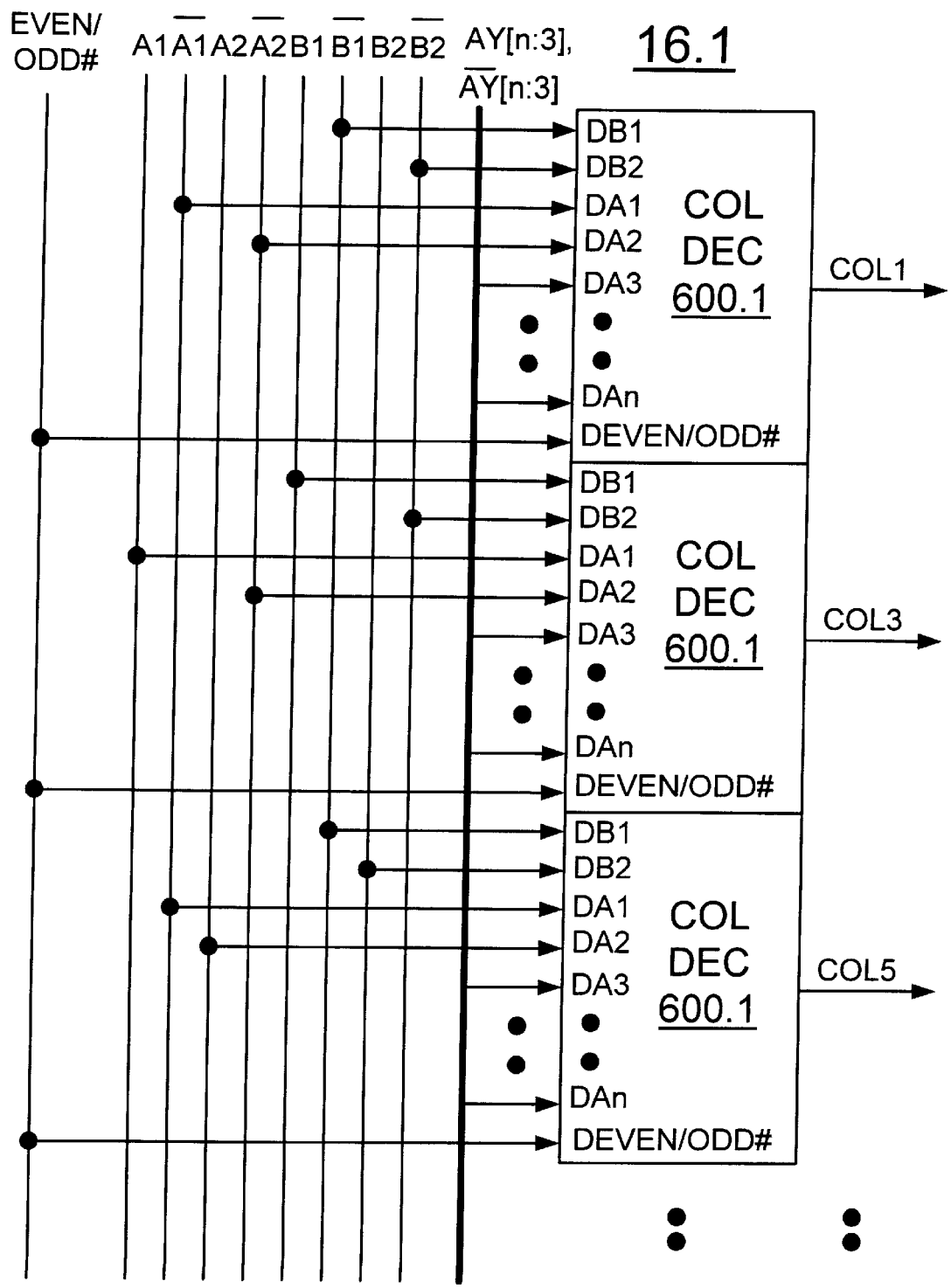

The decoder block 16.1 (FIG. 6B) is similar. Decoders 600.1 for columns 1, 3, 5, . . . generate respective select signals COL1, COL3, COL5 . . . . If the EVEN/ODD# signal is high, the decoder's output COLi is the AND of the decoder inputs DB1, DB2, DA3, . . . DAn. If the EVEN/ODD# signal is low, the decoder's output is the AND of the decoder inputs DA1, . . . DAn. All of the decoders 600.1 are identical in one embodiment.

Figure 7:
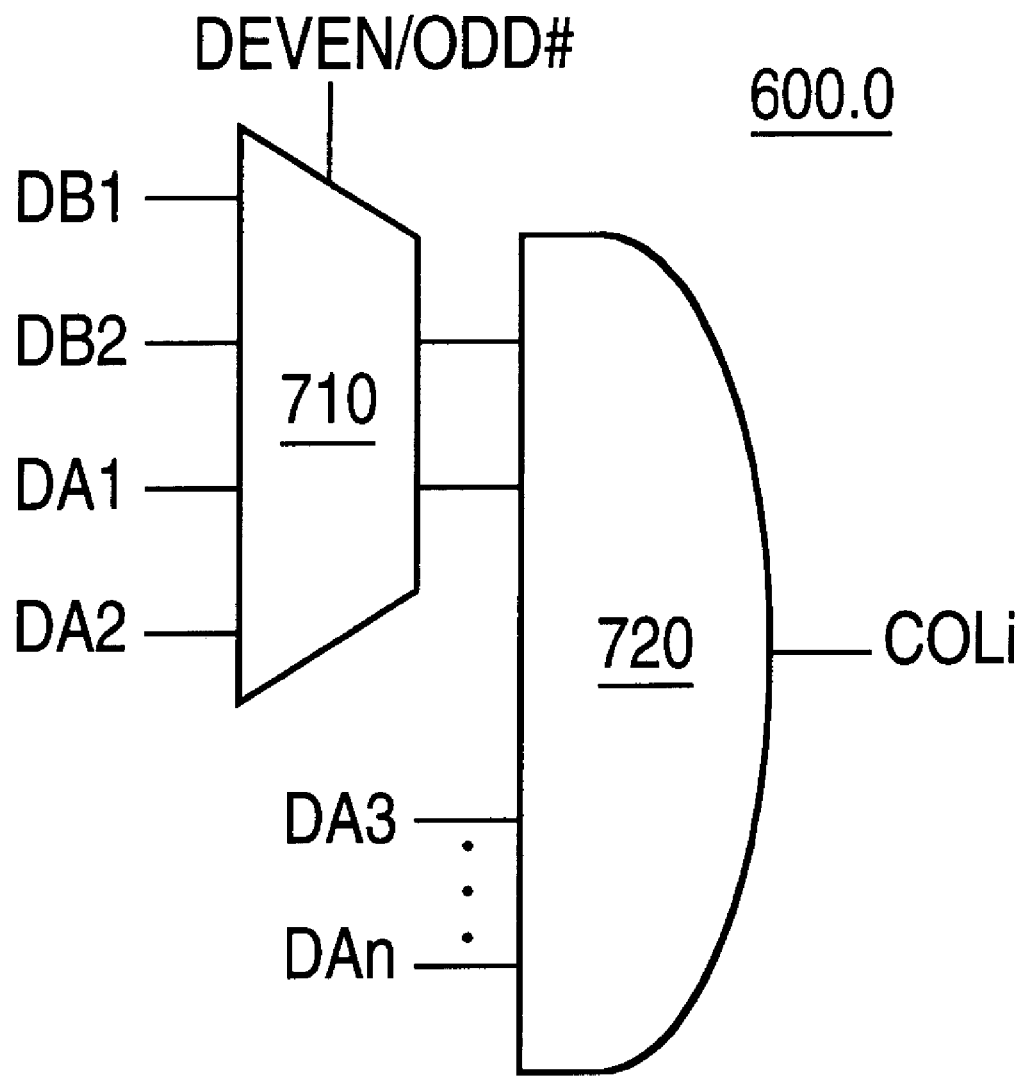
FIGS. 7 and 8 are circuit diagrams of some embodiments of a column decoder for the column decoder blocks of FIGS. 6A, 6B.

FIG. 7 illustrates one embodiment of column decoder 600.0. The decoder inputs DB1, DB2, DA1, DA2 are connected to respective inputs of 4:2 multiplexer 710. If the decoder input DEVEN/ODD# is high, the multiplexer selects DA1, DA2. If the input EVEN/ODD# is low, the multiplexer selects DB1, DB2. The multiplexer outputs and the decoder inputs DA3, . . . DAn are ANDed by AND gate 720. AND gate 720 provides the column select signal COLi.

In some embodiments, each column decoder 600.1 is similar, except that when EVEN/ODD# is high, the multiplexer 710 selects DB1, DB2, and when EVEN/ODD# is low, the multiplexer selects DA1, DA2.

Figure 8:
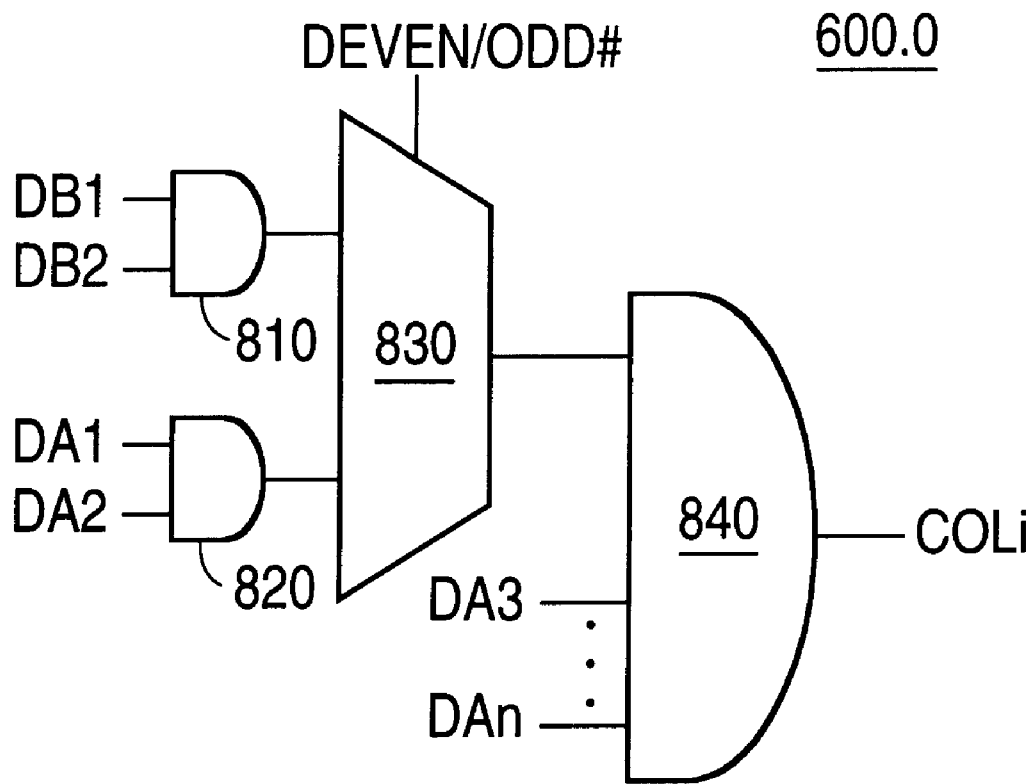

FIG. 8 illustrates another embodiment of a column decoder 600.0. AND gate 810 generates the AND of signals DB1, DB2. AND gate 820 generates the AND of signals DA1, DA2. If DEVEN/ODD# is high, then 2:1 multiplexer 830 selects the output of gate 820. If DEVEN/ODD# is low, the multiplexer selects the output of gate 810. The output of multiplexer 830 and the signals DA3, . . . , DAn are ANDed by AND gate 840. The output of gate 840 is the select signal COLi.

In some embodiments, the column decoders 600.1 are similar, except that when DEVEN/ODD# is high, the multiplexer 830 selects the output of gate 810, and when DEVEN/ODD# is low, the multiplexer 830 selects the output of gate 820.

Other column decoder designs are also possible.

Because all of the column decoders 600.0 are identical to each other, and all of the column decoders 600.1 are identical to each other, the column decoder design is simplified. Further, in some embodiments, column decoders 600.0, 600.1 are similar to each other. Column decoder 600.1 is obtained from a decoder 600.0 simply by supplying the signal EVEN#/ODD to the DEVEN/ODD# input of column decoder 600.0. In another embodiment, decoder 600.0 is obtained from a decoder 600.1 by supplying the EVEN#/ODD signal to the DEVEN/ODD# input of decoder 600.1.

Figure 9A:
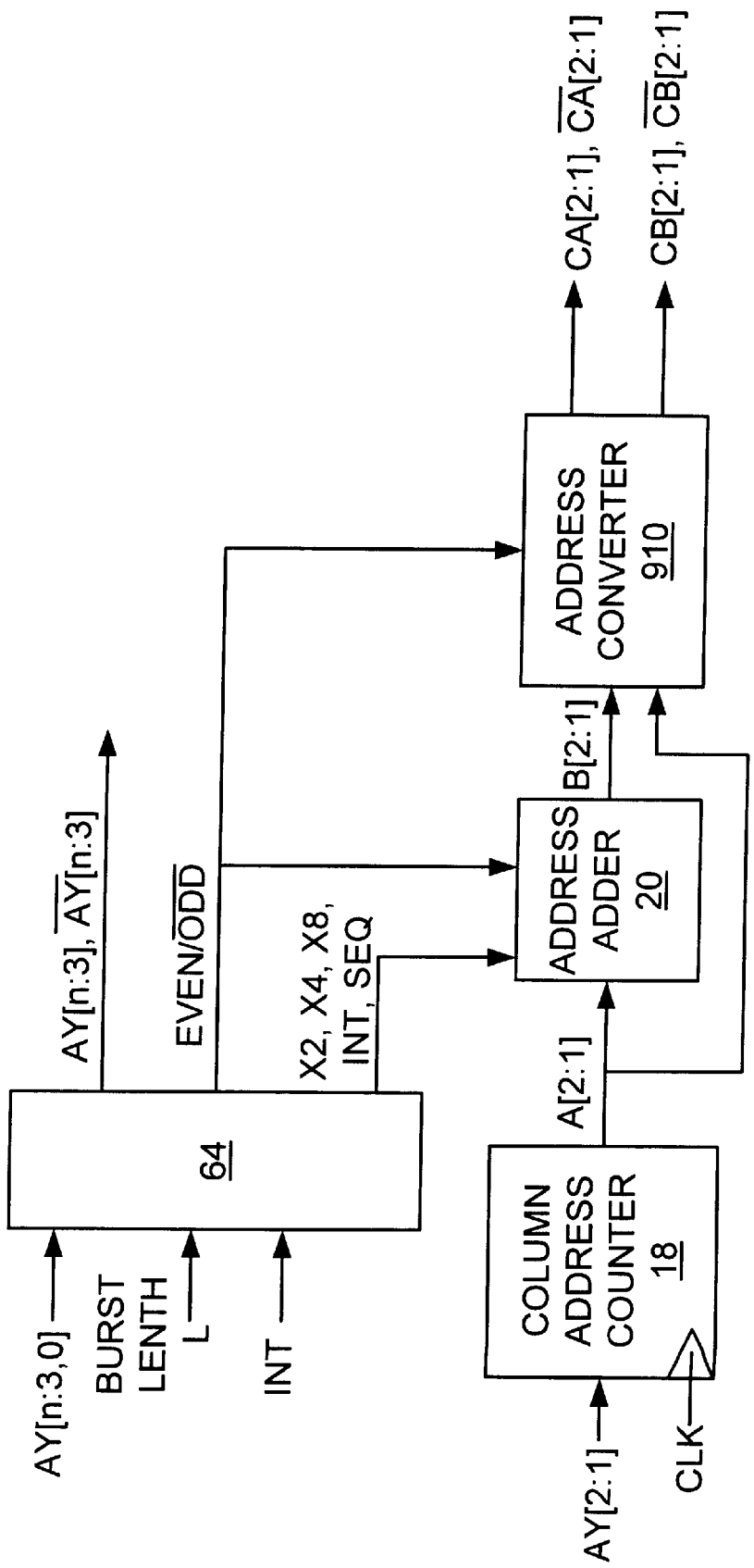
FIGS. 9A, 9B are block diagrams of another memory according to some embodiments of the present invention.
Figure 9B:
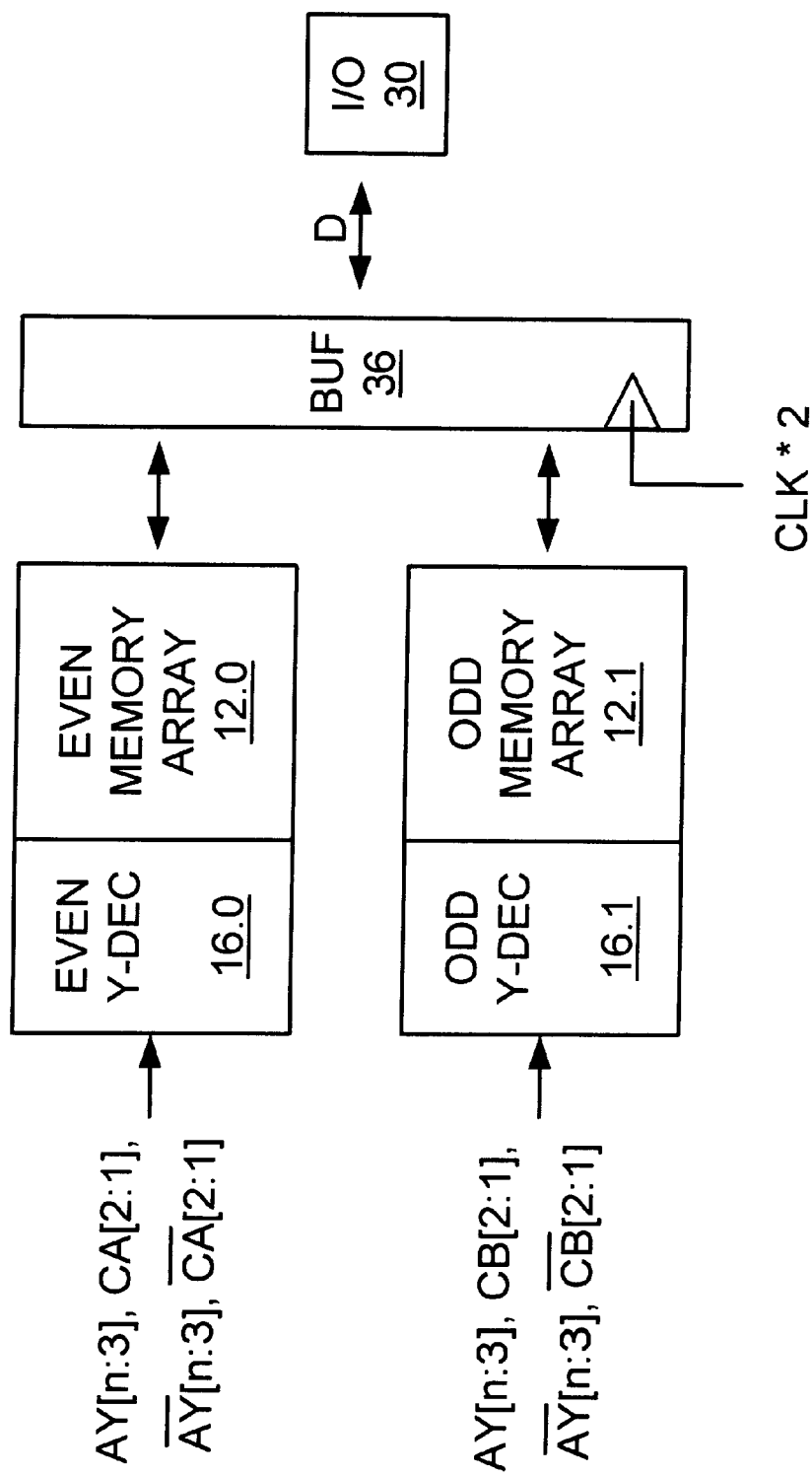

In the memory of FIGS. 9A, 9B, the column decoder blocks 16.0, 16.1 can be identical to the prior art column decoder blocks 16.0, 16.1 of FIG. 2. Address converter 910 receives the signals A[2:1] and B[2:1] and generates signal CA[2:1] and its complement $\overline{CA}[2:1]$, and also signal CB[2:1] and its complement $\overline{CB}[2:1]$. If the signal EVEN/$\overline{ODD}$ is high, then CA[2:1]=A[2:1], and CB[2:1]=B[2:1]. If the signal EVEN/$\overline{ODD}$ is low, then CA[2:1]=B[2:1], and CB[2:1]=A[2:1].

Signals CA[2:1], $\overline{CA}[2:1]$, $\overline{AY}[n:3]$, AY[n:3] are provided to even Y-decoder block 16.0. Signals CB[2:1], $\overline{CB}[2:1]$, AY[n:3], $\overline{AY}[n:3]$ are provided to odd Y-decoder block 16.1.

In some embodiments, each column decoder (not shown) in decoder block 16.0, 16.1 is a conventional AND gate. Each column decoder in block 16.0 decodes the column address <AY[n:3], CA[2:1]> to select a respective even column. If the column's address bit i (i>2) is 0, then the respective input of the decoder's AND gate receives the signal $\overline{AY}[i]$. If the address bit i is 1, then the respective input receives AY[i]. Likewise, for i=1 or 2, if the address bit i is 0, the respective decoder input receives the signal $\overline{CA}[i]$. If the address bit i is 1, the respective decoder input receives the signal CA[i].

Column decoder block 16.1 is similar except that the signals CB[2:1], $\overline{CB}[2:1]$ replace the signals CA[2:1], $\overline{CA}[2:1]$ respectively.

Figure 10:
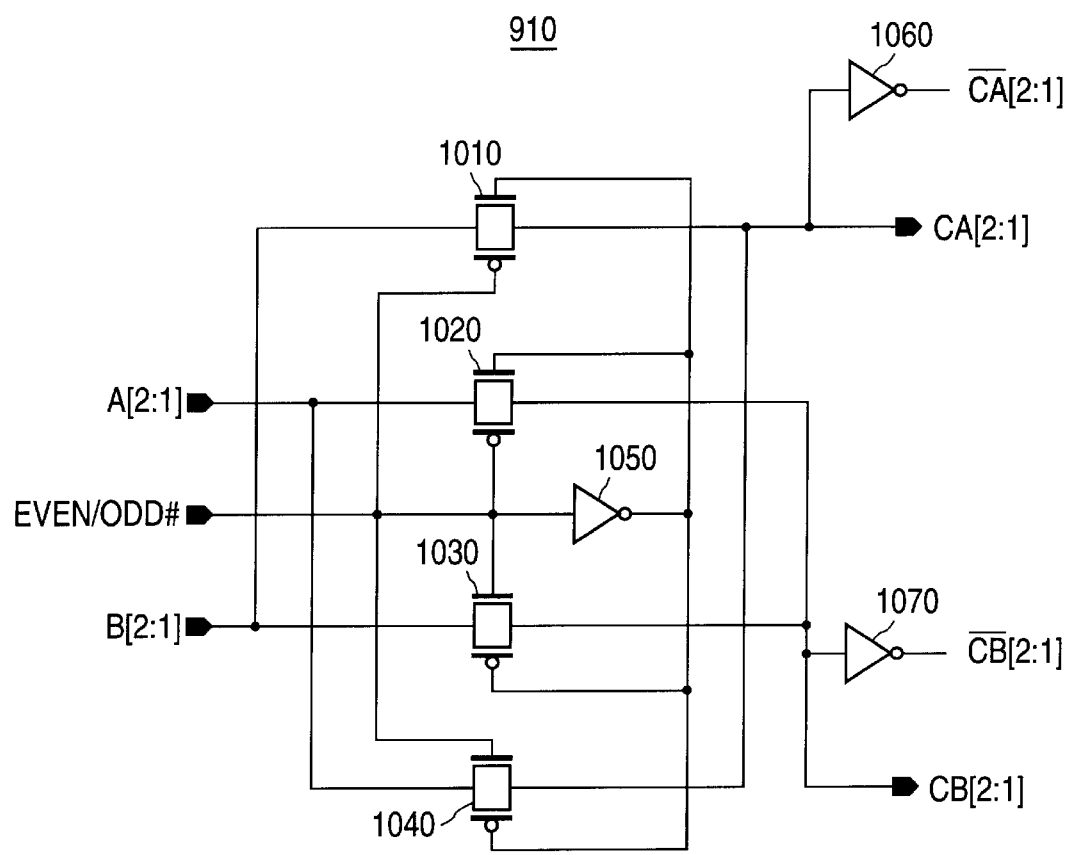
FIG. 10 is a circuit diagram of an address converter of the memory of FIG. 9A, 9B in some embodiments.

FIG. 10 illustrates one embodiment of address converter 910. Transfer gate symbol 1010 represents two transfer gates whose NMOS gates are connected together and whose PMOS gates are connected together. The input of one of the transfer gates receives the signal B2. The output of the transfer gate is connected to the output CA2 (that is, CA[2]) of the address converter. The input of the other transfer gate receives the signal B1. The output of this transfer gate is connected to the output CA1.

Similarly, the transfer gate symbol 1020 represents two transfer gates. One of the transfer gates has its input receiving the signal A2 and has its output connected to address converter output CB2. The other one of the transfer gates has its input receiving the signal A1 and has its output connected to the output CB1.

Transfer gate symbol 1030 represents two transfer gates. One of these transfer gates has its input receiving the signal B2 and has its output connected to the output CB2. The other one of these transfer gates has its input receiving the signal B1, and has its output connected to output CB1.

Symbol 1040 represents two transfer gates. One of these transfer gates has its input receiving the signal A2, and has its output connected to the output CA2. The other one of these transfer gates has its input receiving the signal A1, and has its output connected to the output CA1.

Signal EVEN/ODD# is delivered to the PMOS gates of the transfer gates 1020, 1010, and to the NMOS gates of the transfer gates 1030, 1040. Signal EVEN/ODD# is inverted by inverter 1050. The output of inverter 1050 is connected to the NMOS gates of transfer gates 1010, 1020, and to the PMOS gates of transfer gates 1030, 1040.

Inverter device 1060 consists of two inverters which invert the respective signals CA2, CA1, and provide the respective complement signals $\overline{CA2}$, $\overline{CA1}$. Inverter device 1070 consists of two inverters which invert the respective signals CB2, CB1, and provide the respective complement signals $\overline{CB2}$, $\overline{CB1}$.

In some embodiments, the memory of FIGS. 9A, 9B can be made smaller than the memory of FIG. 3 because the function of the multiplexers 710, 810 (FIGS. 7, 8) is performed by address converter 910 for all the decoders and because, therefore, this function does not have to be incorporated into each decoder. Further, in the memory of FIGS. 9A, 9B, all the decoders in blocks 16.0, 16.1 are identical, which simplifies memory design.

Figure 11:
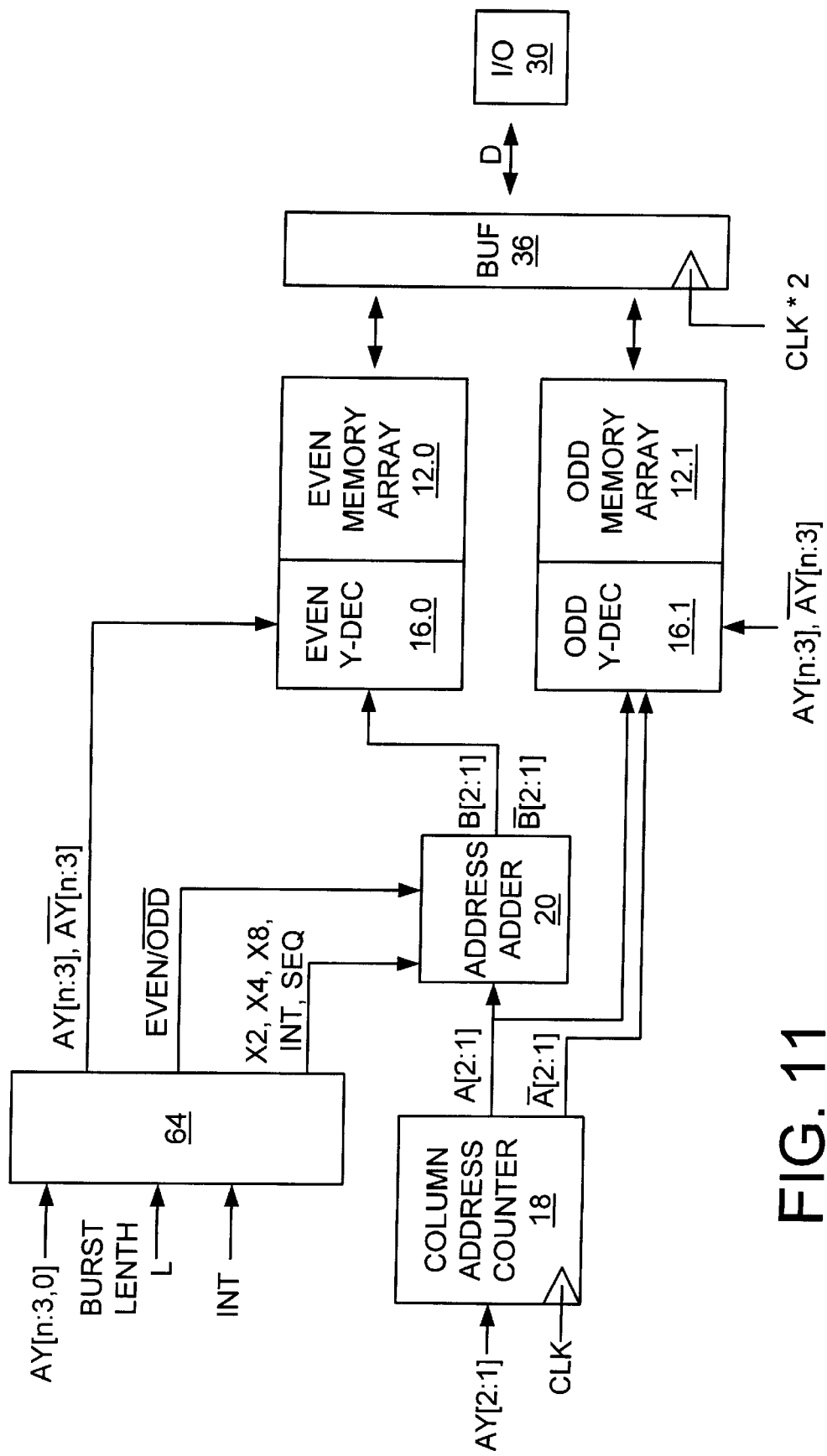
FIGS. 11, 12A and 12B are block diagrams of memories according to some embodiments of the present invention.

Further simplification and area reduction are obtained in the memory of FIG. 11. In this memory, address converter 910 is eliminated. Column decoder blocks 16.0, 16.1 can be identical to the column decoder blocks 16.0, 16.1 of FIG. 2 or 9B. Column decoder block 16.0 decodes the partial address <AY[n:3],B[2:1]> (i.e., the decoder block receives B[2:1], $\overline{B[2:1]}$ instead of CA[2:1], $\overline{CA[2:1]}$ as in FIG. 9B). Column decoder block 16.1 decodes the partial address <AY[n:3],A[2:1]>. Hence, when the starting address is odd, the decoder blocks 16.0, 16.1 decode the same address signals as the decoder blocks of FIG. 3. If the starting address is even, the decoder block 16.0 of FIG. 3 decodes the partial address containing bits A[2:1], and the decoder block 16.1 decodes the partial address containing bits B[2:1]. However, in this case, A[2:1]=B[2:1], so the decoder blocks 16.0, 16.1 of FIG. 11 select the same columns as in FIG. 3.

Figure 12A:
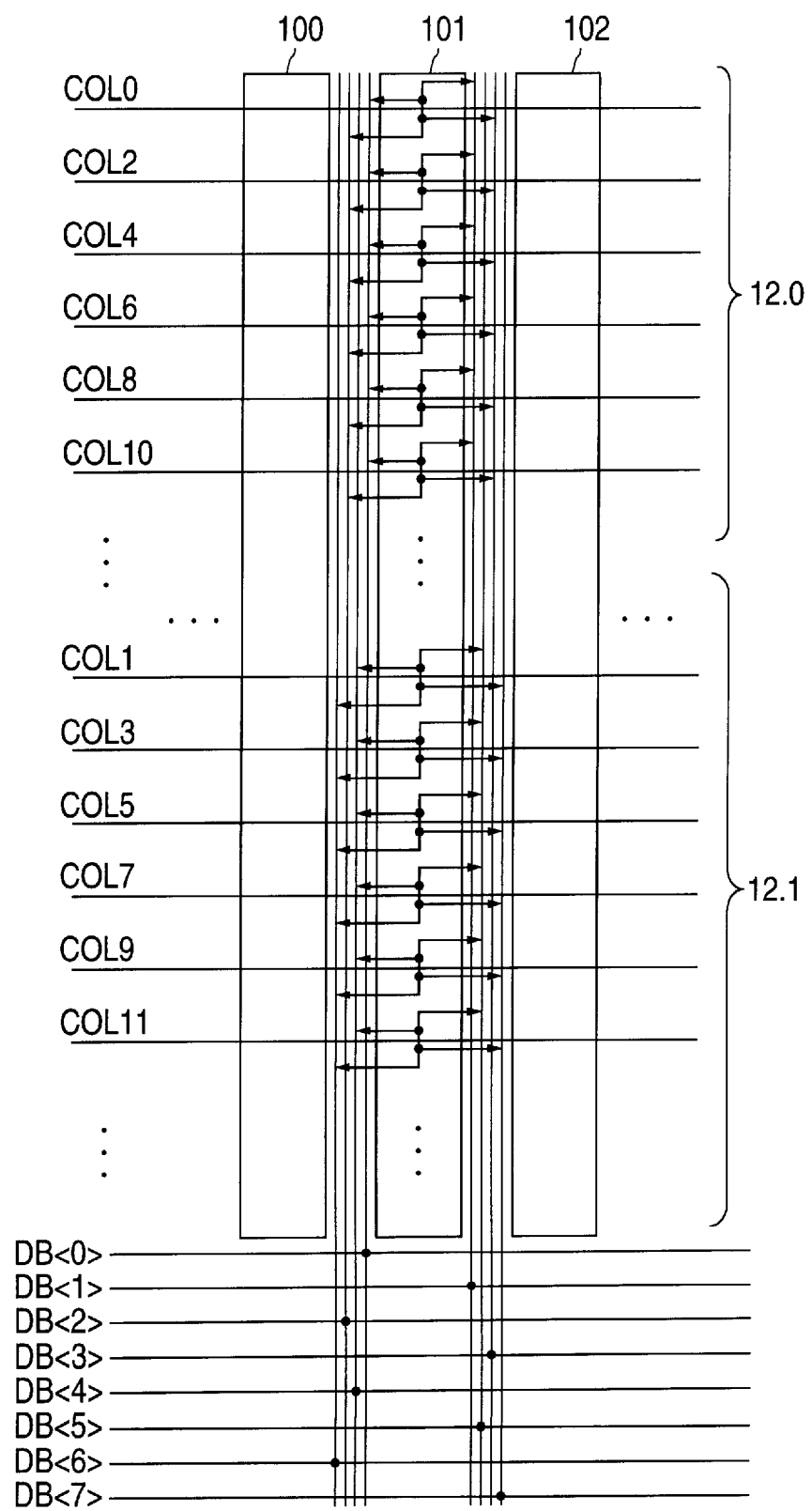
Figure 12B:
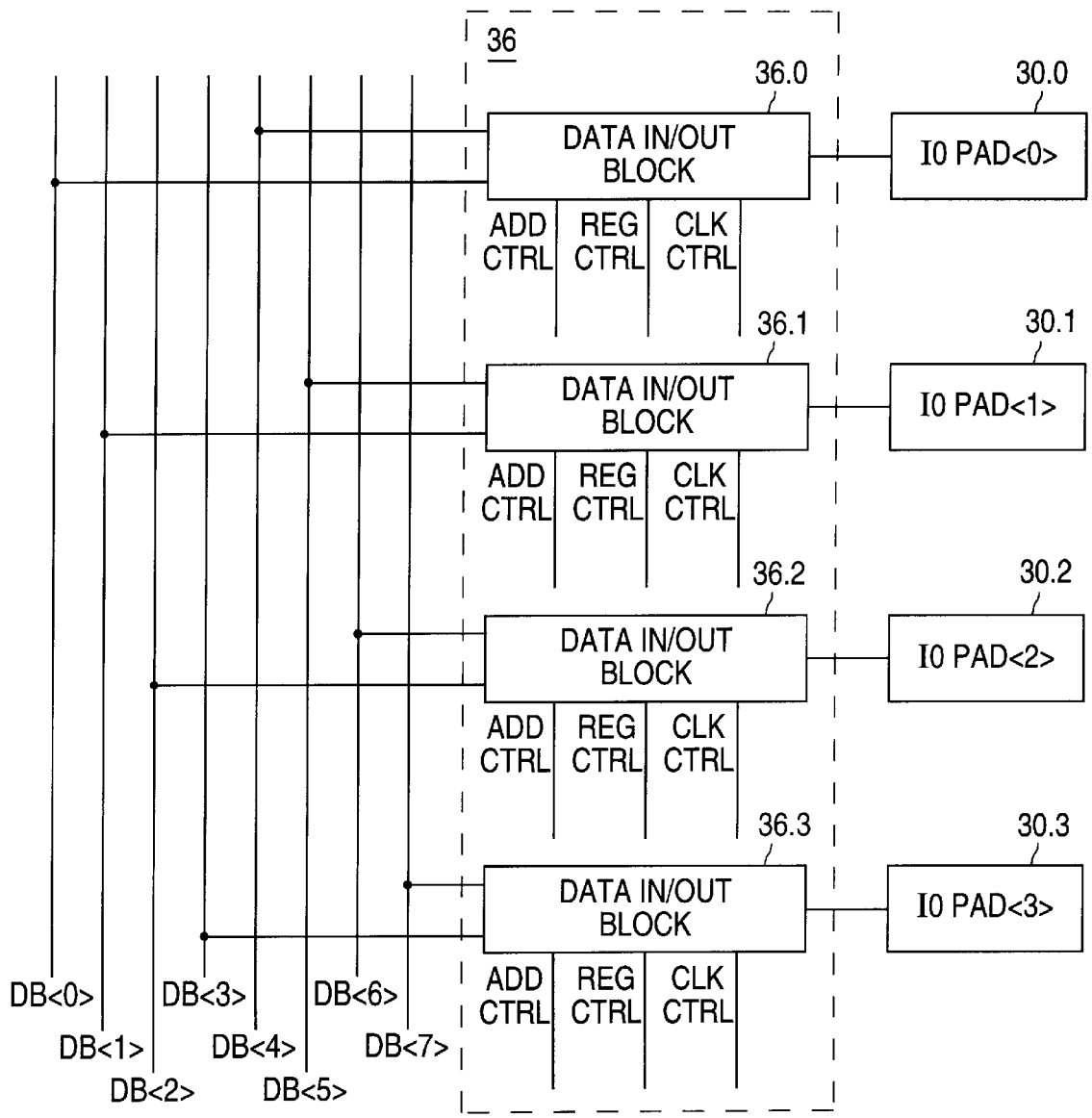

FIGS. 12A, 12B show a memory circuit according to one embodiment of the present invention. This circuit is a portion of an SDRAM device having a by-four output configuration (i.e., four I/O pads). The memory includes DRAM cell array sections 100, 101, 102. Each array section includes a plurality of rows and columns of DRAM cells (not shown). Data bus lines DB<0>, DB<2>, DB<4>, and DB<6> run between array sections 101 and 102. Data bus lines DB<1>, DB<3>, DB<5>, and DB<7> run between sections 100 and 101. Each array section 100, 101, 102 includes an odd portion 12.1 (bottom half in FIG. 12A) and an even portion 12.0 (top half in FIG. 12A). The even portion 120 of each array section includes even numbered columns 0, 2, 4, . . . . The odd portion 12.1 of each array section includes odd numbered columns 1, 3, 5, . . . . The sections 100, 101, 102 share the column decoder circuitry of FIG. 3 or 11. Other memory sections (not shown) can be present, organized as sections 100, 101, 102, possibly with their own column decoders.

The even and odd portions 12.0, 12.1 of each section may share row decoders (not shown). Alternatively, separate row decoders may be provided for the even and odd portions.

In FIG. 12B, data I/O blocks 36.0, 36.1, 36.2, 36.3 form buffer 36 (FIGS. 3, 9). Blocks 36.0, 36.1, 36.2, 36.3 are connected to I/O pads 30.0, 30.1, 30.2, 30.3 respectively. Each of I/O blocks 36 has three control input terminals receiving respective signal CLK CTRL, REG CTRL, and ADD CTRL. The ADD CTRL signal indicates whether the starting column address is odd or even, the REG CTRL signal indicates the programmed CAS latency (programmed into the mode register, not shown), and the CLK CTRL signal, which is derived from an external clock, clocks the data transfers through the data I/O blocks.

I/O block 36.0 is connected to lines DB<0> and DB<4>. I/O block 36.1 is connected to lines DB<1> and DB<5>. I/O block 36.2 is connected to lines DB<2> and DB<6>. I/O block 36.3 is connected to lines DB<3> and DB<7>.

In a burst operation, one column from the odd portion 12.1 and one column from the even portion 12.0 and one row are selected. The selected row and the selected odd column cause four data bits to be simultaneously transferred between a four-memory-cell storage unit in the odd portion 12.1 and data bus lines DB<0>–DB<3>. At the same time, the selected row and the selected even column cause four data bits to be simultaneously transferred between a four-memory-cell storage unit in the even portion 12.0 and data bus lines DB<4>–DB<7>. Data I/O blocks 36 store the two sets of four data bits and serially transfer the bits to I/O pads 30 in a read access, and in the opposite direction in a write access.

Data I/O blocks 36 transfer the two sets of four data bits to the I/O pads (in a read access) or from the I/O pads (in a write access) in accordance with the state of control signals CLK CTRL, REG CTRL, and ADD CTRL.

In a read access, if the starting column address is odd, the four data bits from the selected odd column are simultaneously transferred from blocks 36 to the corresponding I/O pads on a rising edge of a clock cycle, and the four data items from the selected even column are simultaneously transferred from blocks 36 to the corresponding I/O pads on the following falling clock edge.

Similarly, in a write access, if the starting column address is odd, four data bits are simultaneously transferred from the four I/O pads to the corresponding blocks 36 on a rising edge of a clock cycle, and four data bits are simultaneously transferred from the four I/O pads to the corresponding blocks 36 on the following falling clock edge. The timing of the data transfers between the Data I/O blocks 36 and data bus lines DB<0>–DB<7> is in accordance with the programmed CAS latency.

As an example, in the interleave mode, with a burst length of 8, and a starting address AY[2:0] of 011 (an odd address), the columns must be accessed in the following order: 3,2,1,0,7,6,5,4.

Suppose the section being accessed in a read access is section 101 (as determined by the row address). In the first array access, columns 3 and 2 in section 101 are selected simultaneously. Four data bits in column 3 are thus transferred from the odd portion of section 101 to the respective data bus lines DB<4>–DB<7>, and simultaneously four data items in column 2 are transferred from the even portion of section 101 to respective data bus lines DB<0>–DB<3>. With ADD CTRL signal indicating an odd starting address, data I/O blocks 36 transfer the data bits received on lines DB<4>–DB<7> to the corresponding I/O pads 30 on a rising edge of a clock cycle, and transfer the data bits received on lines DB<0>–DB<3> to the I/O pads on the following falling clock edge.

In the next memory access, columns 1 and 0 are simultaneously selected (in the same selected row in section 101). Four data bits in column 1 and four data bits in column 0 are simultaneously transferred from the respective odd and even portions of section 101 to respective data bus lines DB<4>–DB<7> and DB<0>–DB<3>. Data I/O blocks 36 then transfer the data bits received on lines DB<0>–DB<7> to I/O pads 30 on the rising and falling edges of a clock cycle, as described above.

The above description of the embodiments of the present invention is illustrative and not limiting. The invention is not limited to any particular burst lengths or output configurations. For example, the invention is applicable to by-eight and by-sixteen output configurations. The invention is not limited to the particular logic of FIGS. 3–8, 9A, 9B, 10, 11, 12A, 12B or any other circuitry. The invention is not limited to the number of memory arrays or array sections. Some embodiments include only one array. The column address may have only 3 bits or fewer. The memory may be unable to perform all of the operations of Table 1. The invention is not limited to any particular signals generated by logic 64. The invention is not limited to the counter 18 counting up. The counter may count down. Further, the counter may count by 2 or some other number rather than 1. The counter may counter from AY[2:0] or some other address bits. In some embodiments some of I/O pads 30 are used for input or for output but not both. The invention includes all the variations and modifications falling within the scope of the appended claims.

What is claimed is:

1. A memory comprising:
   a plurality of columns of memory storage units, each memory storage unit comprising one or more memory cells, each column having a column address;
   an odd column decoder block for decoding an address signal and selecting an odd column (that is, a column having an odd column address);
   an even column decoder block for decoding an address signal and selecting an even column (that is, a column having an even column address);
   a counter for receiving one or more bits of a starting column address of a burst operation, and for providing a count during the burst operation, the count comprising one or more bits of a first column address of a first column to be accessed in the burst operation; and
   a first circuit for receiving one or more bits of the count and generating one or more bits of a second column address of a second column to be accessed in the burst operation in parallel with the first column;
   wherein in at least one burst operation the one or more bits of the first column address are different from the one or more bits of the second column address, and one of the odd and even column decoder blocks is to decode an address signal comprising the one or more bits of the first column address, and, in parallel, the other one of the odd and even column decoder blocks is to decode an address signal comprising the one or more bits of the second column address, so that the odd and even column decoder blocks select in parallel an odd column and an even column at non-consecutive column addresses or at consecutive column addresses starting at an odd address boundary.

2. The memory of claim 1 wherein:
   each of the odd and even column decoder blocks is to decode a partial address comprising all but the least significant bit (LSB) of a column address;
   the counter is for receiving a plurality of bits of the starting column address of the burst operation;
   the count comprises a plurality of bits of the first column address but not the LSB of the first column address, and the one or more bits generated by the first circuit comprise a plurality of bits of the second column address but not the LSB of the second column address;
   in at least one burst operation, the starting column address is odd, the odd column decoder block is to decode a first partial address comprising the plurality of bits of the first column address and, in parallel, the even column decoder block is to decode a second partial address comprising the plurality of bits of the second column address, and in response to the first and second partial addresses the odd and even column decoder blocks are to select in parallel an odd column and an even column at non-consecutive column addresses or at consecutive column addresses at an odd address boundary.

3. The memory of claim 2 wherein:
   the counter is to receive at least bits 1 and 2 of the starting column address, wherein a column address has n bits [n:0], n>1, bit 0 being the least significant and bit n being the most significant;
   the plurality of bits of the first column address comprises bits 1 and 2 of the first column address, and the plurality of bits of the second column address comprises bits 1 and 2 of the second column address.

4. The memory of claim 3 wherein the burst operations comprise one or more of the operations defined by Table 1 with a burst length of 4 or 8 and an odd starting column address.

5. The memory of claim 4 wherein the bits 1 and 2 of the second column address are generated in accordance with Table 2.

6. The memory of claim 4 wherein:
   throughout each of said burst operations, when the starting column address is odd, then the bits 1 and 2 of the first column address are made part of the first partial address, and the bits 1 and 2 of the second column address are made part of the second partial address;
   throughout each of said burst operations, when the starting column address is even, then the bits 1 and 2 of the first column address are made part of the second partial address, and the bits 1 and 2 of the second column address are made part of the first partial address.

7. The memory of claim 4 wherein:
   throughout each of said burst operations, when the starting column address is even, then the bits 1 and 2 of the first column address are equal to the respective bits 1 and 2 of the second column address; and
   throughout each of said burst operations, the bits 1 and 2 of the first column address are made part of the first partial address, and the bits 1 and 2 of the second column address are made part of the second partial address.

8. The memory of claim 4 wherein the memory is a double data rate synchronous dynamic random access memory comprising a pad, wherein in each of said burst operations an odd column and an even column are to be selected in each clock cycle, and in each clock cycle, two data bits are to be transferred from the pad for being written to the respective odd and even columns or two data bits are provided on the pad from the respective odd and even columns.

9. The memory of claim 4 wherein each of the even and odd column decoder blocks comprises a plurality of decoders, and the memory further comprises a second circuit for receiving the one or more non-LSB bits of the first column address, the one or more non-LSB bits of the second column address, and a signal indicating if the starting column address is odd or even, the second circuit having a first output connected to the odd decoder block and a second output connected to the second decoder block;

wherein if the starting address is odd, the second circuit is to provide the one or more non-LSB bits of the first column address on its first output to the odd decoder block, and the one or more non-LSB bits of the second column address on the second output to the even decoder block; and wherein if the starting address is even, the second circuit is to provide the one or more non-LSB bits of the second column address on its first output to the odd decoder block, and the one or more non-LSB bits of the first column address on the second output to the even decoder block.

10. A method for performing a burst operation, the method comprising:

receiving one or more bits of a starting column address of the burst operation, counting from the one or more bits, and generating a count which comprises one or more non-LSB bits of a first column address of a first column to be accessed in the burst operation;

receiving the one or more non-LSB bits of the count and generating one or more non-LSB bits of a second column address of a second column to be accessed in the burst operation in parallel with the first column, wherein the one or more non-LSB bits of the second column address are different from the one or more non-LSB bits of the first column address, wherein one of the first and second column addresses is an even address and the other one of the first and second column addresses is an odd address; and decoding a first address signal comprising the one or more non-LSB bits of the first column address, and decoding a second address signal comprising the one or more non-LSB bits of the second column address, and selecting, in parallel, an even column and an odd column at the first and second column addresses.

11. The method of claim 10 wherein the burst length is at least 4, the count generates a new count in every clock cycle, and one even column and one odd column are selected in every clock cycle.

12. The method of claim 10 wherein the burst operation is one of the burst operations of Table 1 with the burst length 4 or 8 and an odd starting address.

13. The method of claim 12 wherein a column address has n bits [n:0], n>1, bit 0 being the least significant and bit n being the most significant, and wherein the one or more bits of the starting column address comprise bit 1 of the starting column address.

14. The method of claim 13 wherein the one or more bits of the starting column address comprise bits 1 and 2 of the starting column address, wherein the count comprises bits 1 and 2 of the first column address, and the one or more bits of the second column address comprise bits 1 and 2 of the second column address;

wherein for the first pair of an odd column and an even column of the burst operation the bits 1 and 2 of the first column address are equal to the respective bits 1 and 2 of the starting column address, and in each subsequent clock cycle of the burst operation, a value formed by the bits [2:1] of the first column address is incremented by 1 to obtain a new value of the bits [2:1] of the first column address.

15. A memory comprising:

a column address counter for receiving at least bits 1 and 2 of a starting column address [n:0] of a burst operation of Table 1, bit 0 being the least significant and bit n being the most significant, wherein n≧2, the counter being for counting on each clock cycle, and generating a count signal, the count signal comprising at least column address bits [2:1] of a first column to be selected in the burst operation; and an address adder for receiving the count signal and generating at least column address bits [2:1] of a second column to be selected in parallel with the first column, wherein one of the first and second columns is even, the other one of the first and second columns is odd, and the first and second columns are to be accessed in parallel, wherein if the starting column address is odd and a burst length is 4 or 8, then the first and second columns are at non-consecutive column addresses or at consecutive column addresses on an odd column boundary.

16. The memory of claim 15 wherein the first column address is odd and the second column address is even.

17. The memory of claim 15 wherein the memory is a double data rate SDRAM.

* * * * *

UNITED STATES PATENT AND TRADEMARK OFFICE
CERTIFICATE OF CORRECTION

PATENT NO.    : 6,191,997 B1
DATED         : February 20, 2001
INVENTOR(S)   : Son et al.

It is certified that error appears in the above-identified patent and that said Letters Patent is hereby corrected as shown below:

Column 4,
Line 10, delete "defmed" and insert -- defined --;
Line 65, delete "colum n" and insert -- column --; and Column 5,
Line 22, delete "then" and insert -- the n --.

Signed and Sealed this

Thirtieth Day of July, 2002

Attest:

Attesting Officer

JAMES E. ROGAN
Director of the United States Patent and Trademark Office